United States Patent [19]
Sakata et al.

[11] Patent Number: 5,447,294
[45] Date of Patent: Sep. 5, 1995

[54] VERTICAL TYPE HEAT TREATMENT SYSTEM

[75] Inventors: Kazunari Sakata, Sagamihara; Masato Kadobe, Tokyo; Isao Furuya, Yokohama; Shingo Watanabe, Kanagawa; Hiroki Fukushima; Hiroyuki Iwai, both of Sagamihara, all of Japan

[73] Assignees: Tokyo Electron Limited, Tokyo; Tokyo Electron Tohoku Limited, Esashi, both of Japan

[21] Appl. No.: 184,055

[22] Filed: Jan. 21, 1994

[30] Foreign Application Priority Data

Jan. 21, 1993 [JP] Japan .................................. 5-008514
Jan. 21, 1993 [JP] Japan .................................. 5-008515
Jan. 21, 1993 [JP] Japan .................................. 5-008516

[51] Int. Cl.⁶ .......................................... H01L 21/00
[52] U.S. Cl. ........................... 266/257; 432/5; 432/239
[58] Field of Search ............... 266/252, 257, 249; 432/5, 6, 239, 241

[56] References Cited

U.S. PATENT DOCUMENTS

| | | | |
|---|---|---|---|
| 5,236,181 | 8/1993 | Ishii et al. | 266/252 |
| 5,271,732 | 12/1993 | Yokokawa | 432/5 |
| 5,277,579 | 1/1994 | Takanabe | 432/5 |
| 5,360,336 | 11/1994 | Monoe | 432/5 |

*Primary Examiner*—Scott Kastler
*Attorney, Agent, or Firm*—Oblon, Spivak, McClelland, Maier & Neustadt

[57] ABSTRACT

A vertical heat treatment system for heat treating a large number of semiconductor wafers housed in a boat at once includes a heat treatment unit having a boat loading/unloading port, a boat section communicating with the heat treatment unit through the boat loading/unloading port, an elevator mechanism for loading/unloading the boat between the boat section and the heat treatment unit through the boat loading/unloading port, a cassette section provided adjacent to the boat section, a wafer transfer mechanism for transferring wafers between a cassette and the boat, a gas supply mechanism for supplying a non-oxidization gas into the boat section, and a gas shower means for blowing the non-oxidization gas to the wafers in the vicinity of the boat loading/unloading port.

22 Claims, 8 Drawing Sheets

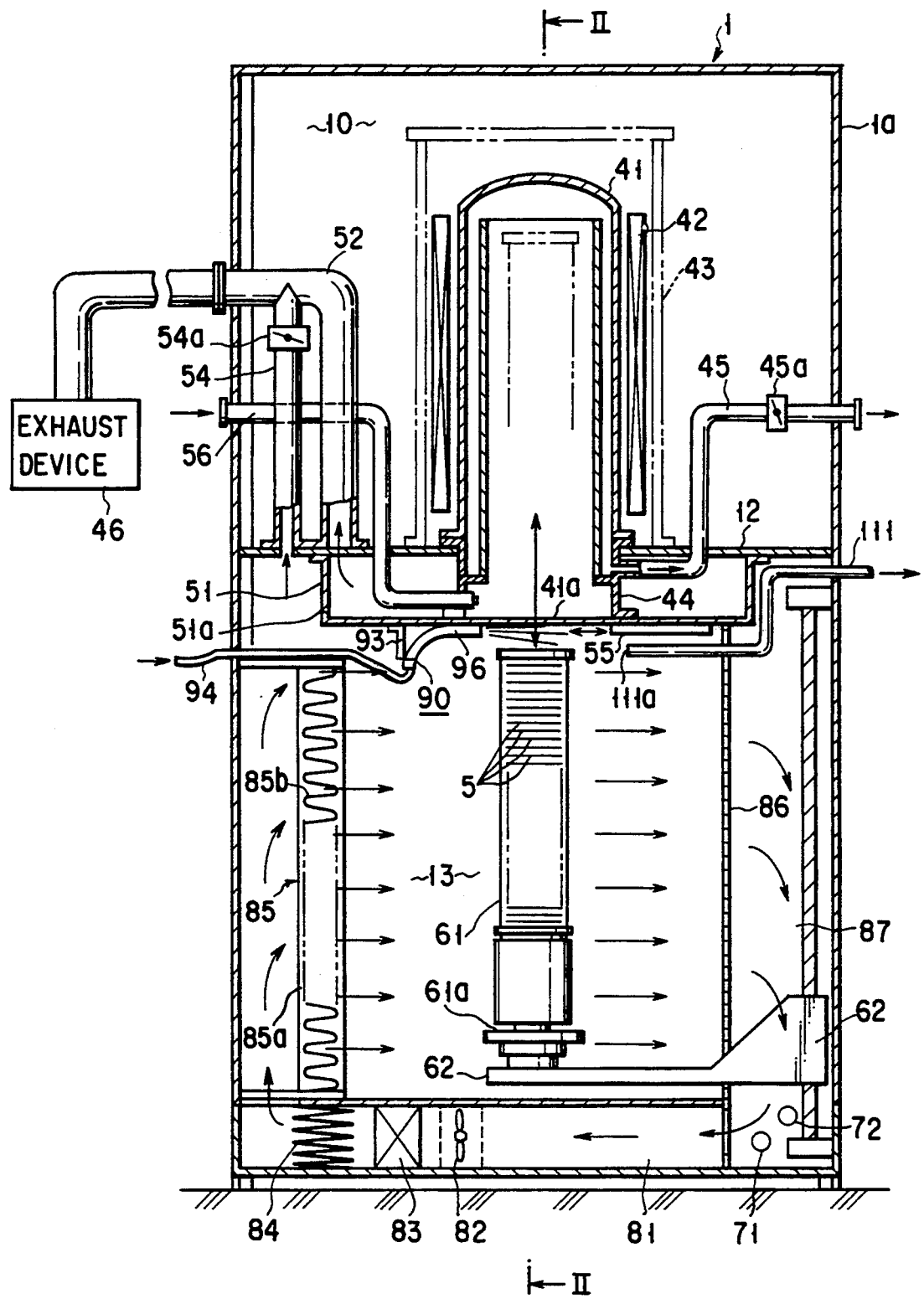
F I G. 1

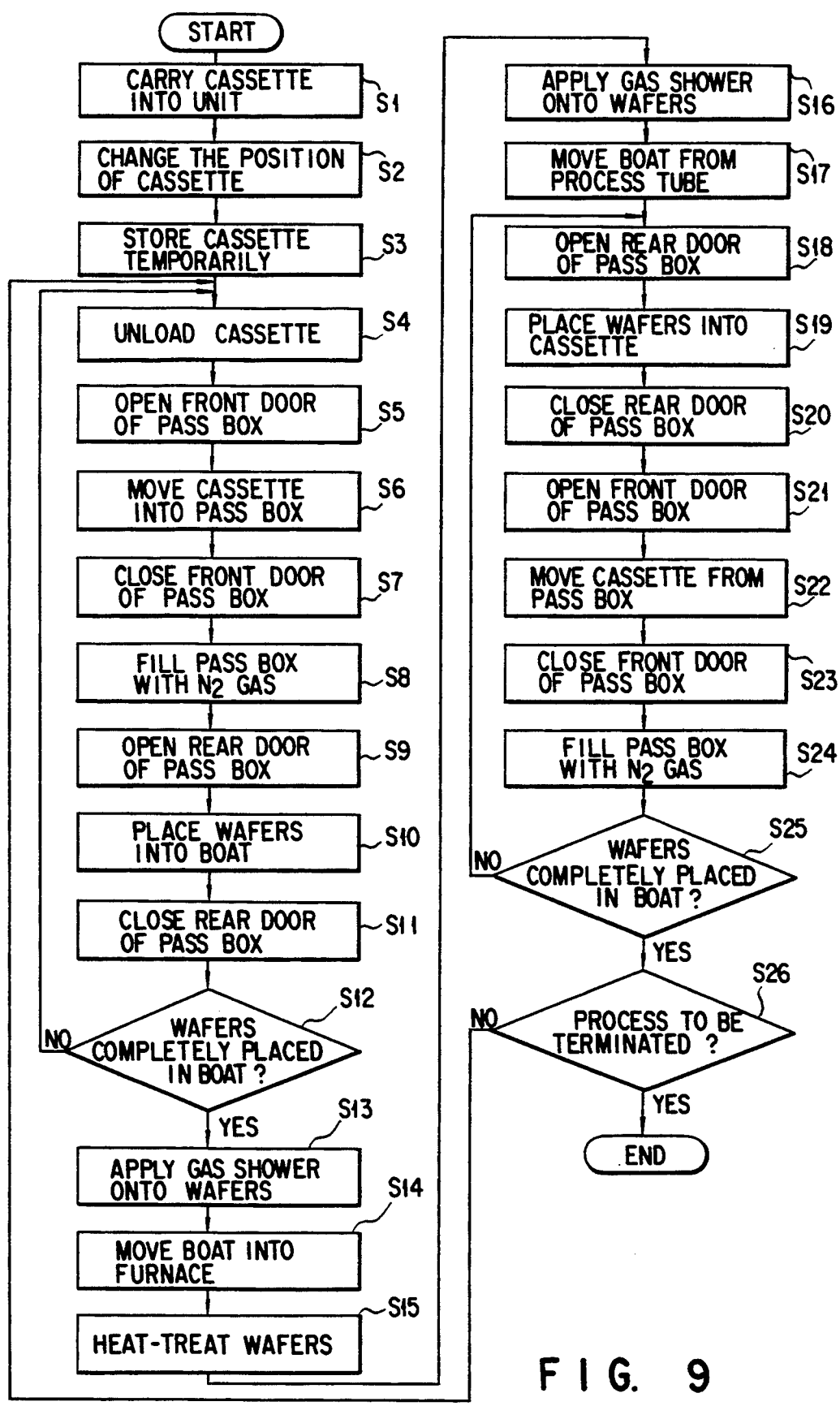
F I G. 9

VERTICAL TYPE HEAT TREATMENT SYSTEM

BACKGROUND OF THE INVENTION

The present invention relates to a vertical type heat treatment system for heat treatment a plurality of semiconductor wafers at once and, more particularly, to a system as a combination of a gas shower mechanism for blowing a gas to wafers loaded/unloaded into/from a furnace, a gas circulating/cooling/cleaning system in a boat section, and a pass box for loading/unloading wafers into/from a cassette.

For example, in a semiconductor device manufacturing process, various types of processing apparatuses are used for forming an oxide film on a semiconductor wafer, a thin film in accordance with thermal CVD, a heavily doped region in accordance with thermal diffusion, and the like.

Heat treatment apparatuses adopted by these various types of processing apparatuses have recently been shifted from conventional horizontal ones to vertical ones. The vertical heat treatment apparatuses will be described hereinafter.

In such a vertical type heat treatment system, when a carrier (cassette) housing a large number of semiconductor wafers aligned in order is introduced to the loading/unloading area of the apparatus body, this carrier is placed on a transfer stage by, e.g., a carrier transfer. The semiconductor wafers in the carrier on the transfer stage are transferred to the wafer boat at the loading area one by one or in units of five wafers and stored and held in a multiple of stages. In this state, the wafer boat is moved upward by a boat elevator to load the semiconductor wafers into a process tube. The process tube is sealed and heated while substituting its internal gas with a predetermined process gas, thereby performing a required processing operation to the semiconductor wafers.

The processed semiconductor wafers are moved downward by the boat elevator from the interior of the process tube together with the wafer boat and withdrawn to the loading area immediately under the process tube. The semiconductor wafers are then returned from the loading area into the carrier on the transfer stage by the wafer transfer, and removed outside the apparatus body or conveyed to a connected processing apparatus of a subsequent process from the loading/unloading area together with the carrier.

In this processing operation by the vertical type heat treatment system, when the semiconductor wafers are moved upward together with the wafer boat from the loading area (boat section) and loaded into the process tube, or are moved downward from the process tube after processing in the process tube and withdrawn, the vicinity of a furnace port located midway along this process is set in a considerably high temperature atmosphere. If the outer air exists at this portion, a spontaneous oxide film is undesirably formed on the surface of the semiconductor wafer by the $O_2$ gas in the outer air. For this reason, to perform the boat loading/unloading operation in an inert gas atmosphere (non-oxygen atmosphere) of, e.g., $N_2$ gas, the interior of the apparatus body, especially the loading area, is desired to be substituted with and maintained in a $N_2$ gas atmosphere as a closed system structure separated from the outer air by a gas supply/exhaust means.

Furthermore, the gas atmosphere in the apparatus body must always be held at a positive pressure so as to prevent the outer air from entering in it. Since the semiconductor wafer processing operation is repeatedly performed, gaseous impurities, e.g., carbon, and particle impurities, e.g., oil mist or dust, are formed in the gas atmosphere in the apparatus body. These impurities are deposited on the semiconductor wafers or cause chemical contamination to degrade the characteristics and yield of the semiconductor devices. Therefore, it is desired that a clean inert gas is always introduced into the apparatus body as a purge gas, thereby maintaining the inert gas atmosphere in the apparatus body at a high-purity positive pressure.

However, even when the vertical type heat treatment system has the closed system structure as described above, it is difficult to maintain the interior of the apparatus body, especially the loading area in a high-purity inert gas atmosphere. When the semiconductor wafers are loaded/unloaded into/from the process tube while they are held in the wafer boat in a multiple of stages, gaseous impurities, e.g., $O_2$, and particle impurities exist among the semiconductor wafers, or heat gets involved, so that the impurities are deposited on the semiconductor wafers or cause chemical contamination (formation of a natural oxide film, and the like) leading to a defect, thereby degrading the characteristics and yield of the semiconductor elements.

SUMMARY OF THE INVENTION

It is an object of the present invention to provide a processing apparatus having very high performance which, when loading/unloading substrates into/from a process chamber, expels, by blowing, the impurities, e.g., $O_2$, attaching to the substrates and heat in the vicinity of the loading/unloading port of the process chamber, thereby suppressing deposition of impurities on a processing target or chemical contamination (formation of a natural oxide film, and the like) very effectively.

It is another object of the present invention to provide a gas shower nozzle which, when loading the substrates from the loading area into the process chamber or unloading the substrates from the process chamber into the loading area, expels, by blowing, impurities, e.g., $O_2$, attaching to the substrates and heat very effectively.

According to an aspect of the present invention, there is provided a vertical type heat treatment system comprising:

- a heat treatment unit having a boat loading/unloading port;
- a boat section communicating with the heat treatment unit through the boat loading/unloading port;
- elevator means for loading/unloading a boat between the boat section and the heat treatment unit through the boat loading/unloading port;
- a cassette section provided adjacent to the boat section;
- wafer transfer means for transferring wafers between a cassette and the boat;
- gas supply means for supplying a non-oxidization gas into the boat section; and
- gas shower means for blowing the non-oxidization gas to the wafers in the vicinity of the boat loading/unloading port.

A nozzle is mounted on the distal end of the gas shower means. The nozzle has an injection port so that the non-oxidization gas is injected to the wafers in a direction perpendicular to the direction along which the wafers are aligned and throughout substantially the entire width of the wafers. Hence, the gaseous impurities, e.g., $O_2$, and particle impurities present among the semiconductor wafers can be reliably removed. Also, the thermal influence applied by the heat treatment unit to the boat section can be decreased.

According to another aspect of the present invention, there is provided a vertical type heat treatment system comprising:
- a heat treatment unit having a boat loading/unloading port;
- a boat section communicating with the heat treatment unit through the boat loading/unloading port;
- elevator means for loading/unloading a boat between the boat section and the heat treatment unit through the boat loading/unloading port;
- a cassette section provided adjacent to the boat section;
- wafer transfer means for transferring wafers between a cassette and the boat;
- gas supply means for supplying a non-oxidization gas into the boat section; and
- a gas circulating/cooling/cleaning system for circulating, cooling, and cleaning the gas in the boat section.

According to still another aspect of the present invention, there is provided a vertical type heat treatment system comprising:
- a heat treatment unit having a boat loading/unloading port;
- a boat section communicating with the heat treatment unit through the boat loading/unloading port;
- elevator means for loading/unloading a boat between the boat section and the heat treatment unit through the boat loading/unloading port;
- a cassette section provided adjacent to the boat section;
- wafer transfer means for transferring wafers between a cassette and the boat;
- first gas supply means for supplying a non-oxidization gas into the boat section;
- a pass box having a first opening with a front door communicating with the cassette section and a second opening with a rear door communicating with the boat section; and
- second gas supply means for supplying the non-oxidization gas into the pass box.

BRIEF DESCRIPTION OF THE DRAWINGS

FIG. 1 is a longitudinal sectional view showing a vertical type heat treatment system according to an embodiment of the present invention;

FIG. 9 is a flow chart for heat treatment semiconductor wafers by the vertical type heat treatment system of the present invention.

DETAILED DESCRIPTION OF THE PREFERRED EMBODIMENTS

A vertical type heat treatment system according to the preferred embodiment of the present invention will be described with reference to the accompanying drawings. The vertical type heat treatment system of this embodiment is used as an oxidization diffusion furnace for forming an insulting film on a semiconductor wafer or as a CVD furnace for forming a conductive film on the wafer.

Figure 2:
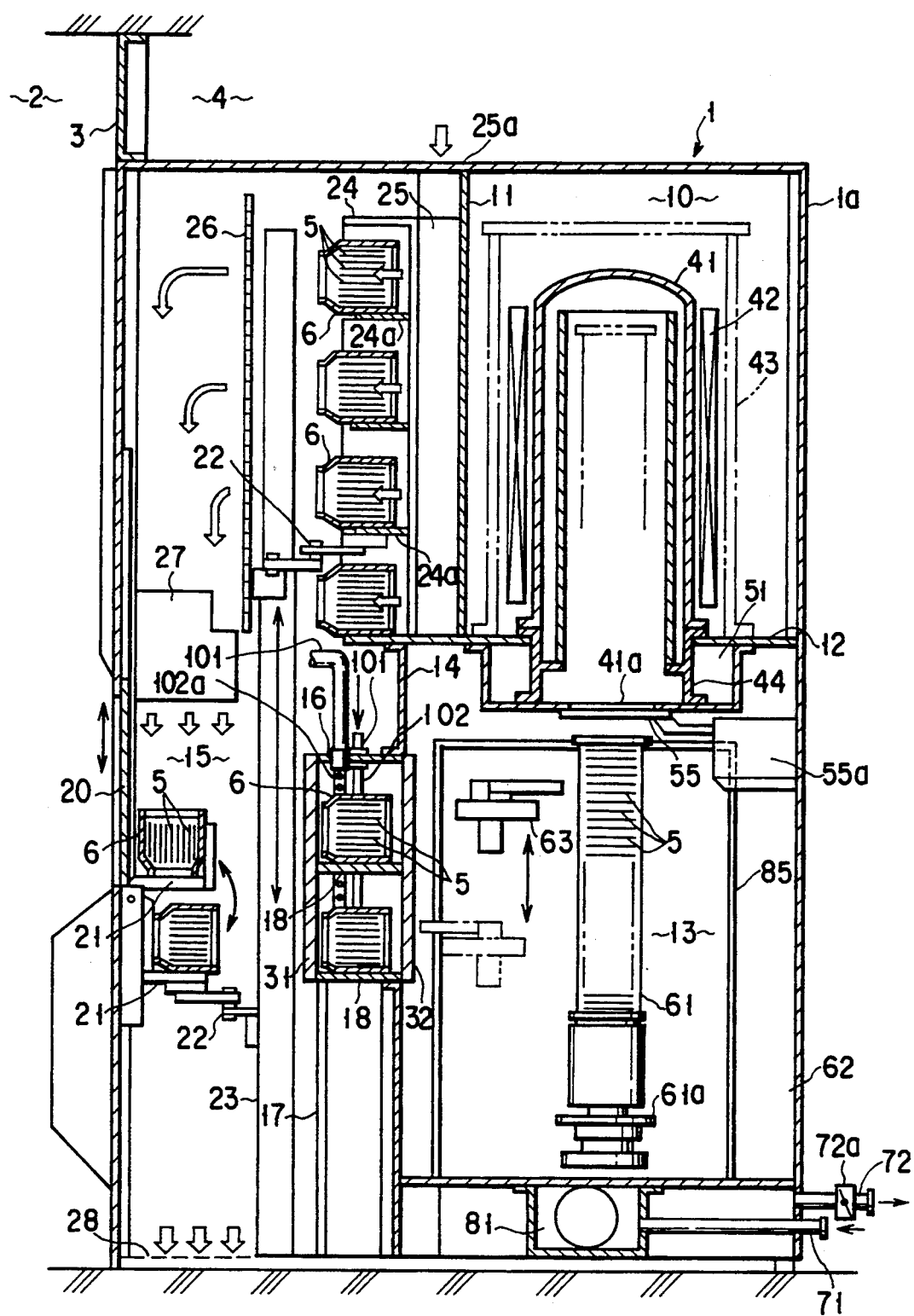
FIG. 2 is a longitudinal sectional view showing the vergical type heat treatment system taken along the line II—II of FIG. 1.
Figure 3:
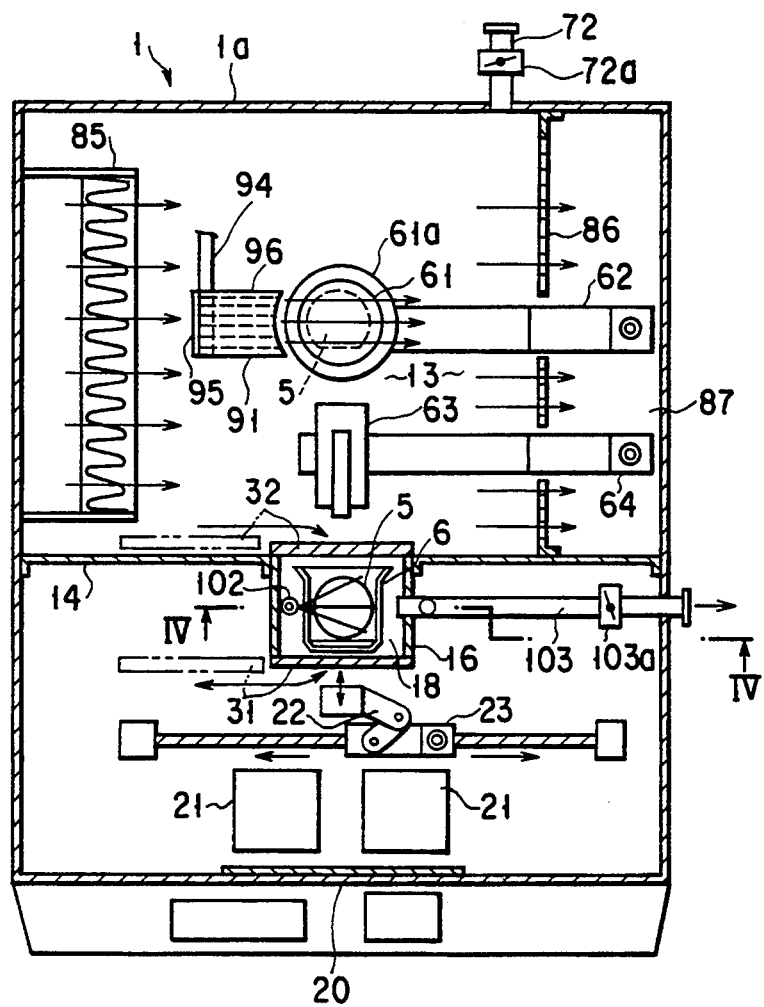
FIG. 3 is a cutaway plan view of the vertical type heat treatment system showing its lower chamber.

As shown in FIGS. 1 to 3, a housing unit 1 of the vertical type heat treatment system forms a large box having a width of about 1 m, a depth of about 2 m, and a height of about 3 m. The unit 1 is a housing obtained by combining metal thin-plate panels 1a. The front portion of the unit 1 faces a clean room 2 in the factory, and most of other portions of the unit 1 are divided from the clean room 2 by a partition wall 3 and located in a maintenance room 4.

A heat treatment chamber 10 is provided at substantially the upper half of the rear portion in the unit 1. The heat treatment chamber 10 has a CVD furnace for forming films respectively on a large number of wafers 5 at once. The CVD furnace is constituted by a process tube 41, a heater 42, and a punching panel housing 43. A lower opening 41a of the process tube 41 communicates with a lower chamber (boat section or loading area) 13. The lower chamber 13 is separated from the heat treatment chamber 10 by a partition wall 12. The lower chamber 13 is also separated from a cassette section (I/O area) 15 by a partition wall 14. Furthermore, the cassette section 15 is separated from the heat treatment chamber 10 by a partition wall 11.

A front door 20 is provided to the cassette section 15. When the front door 20 is opened, the cassette section 15 communicates with the next room 2. The front door 20 is automatically vertically closed/opened. Cassettes 6 are loaded from the next room 2 into the cassette section 15. Twenty-five semiconductor wafers are aligned in each cassette 6 at a constant pitch to be parallel to each other.

A pass box 16 is fitted in part of the partition wall 14 and supported at an appropriate height by a stand 17. The pass box 16 is a hermetic chamber which is used for conveying the cassettes 6 between the cassette section 15 and the boat section 13. Upper and lower stages 18 are provided in the pass box 16, and one cassette 6 is placed on each stage 18.

As shown in FIG. 2, two posture change mechanisms 21 are provided in the cassette section 15 in the vicinity of the front door 20. The wafers 5 are vertically held in the cassettes 6 loaded into the cassette section 15. The posture change mechanisms 21 rotate the cassettes 6 through 90°, thereby setting the wafers 5 from the vertical state to the horizontal state and vice versa.

A cassette transfer 22 is supported by an elevator 23 immediately behind the posture change mechanisms 21 to be vertically movable. A cassette stock stage 24 is provided behind the cassette transfer 22 and above the pass box 16. The cassette stock stage 24 has a plurality of shelves 24a capable of storing the cassettes 6, conveyed from the posture change mechanisms 21 by the cassette transfer 22, in 2 arrays ×4 stages in the same horizontal direction.

The interior of the cassette section 15 is set in the outer air atmosphere. A first filter unit 25 is provided between the rear surface of the cassette stock stage 24 and the partition wall 11. The first filter unit 25 is a vertically long unit incorporating a filter and a fan. The first filter unit 25 has, at its upper end, an air suction port 25a which is open to the top plate portion of the housing unit 1. The clean air in the maintenance room 4 can be drawn through the air suction port 25a and flowed sideways toward the cassettes 6 of the stage 24 through the filter. A straightening plate 26 is provided in front of the cassette stock stage 24. A large number of holes are formed in the straightening plate 26 to aid a side flow of air.

A second filter unit 27 incorporating a filter and a fan is provided in the lower front of the straightening plate 26. The clean air flowing from the first filter unit 25 through the straightening plate 26 is cleaned again by the second filter unit 27. The down flow of the clean air flows among the wafers 5 (vertically held in the cassettes 6) on the posture change mechanisms 21.

The clean air is then discharged to the outer maintenance room 4 through holes 28 in a floor plate (punching plate).

Figure 4:
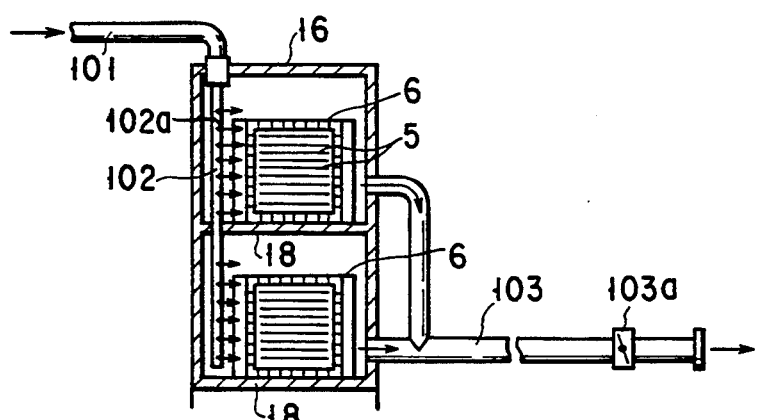
FIG. 4 is a longitudinal sectional view of a pass box taken along the line IV—IV of FIG. 3.

As shown in FIG. 4, the pass box 16 is a small-size (small-capacity) vertically long box. The pass box 16 has a front door 31 and a rear door 32 which are automatically opened and closed in the horizontal direction. When the front door 31 is opened, the interior of the pass box 16 communicates with the cassette section 15; when the rear door 32 is opened, it communicates with the boat section 13. These auto doors 31 and 32 have opening/closing driving means (not shown) that can be driven independently of each other.

The vertical process tube 41 is provided in the heat treatment chamber 10. The process tube 41 is made of quartz or the like. The heater 42 is provided to surround the process tube 41, and the protection cover 43 incorporating a cooling pipe, an insulating material, and the like is applied on the heater 42.

The lower end of the lower opening 41a of the process tube 41 is connected to a manifold 44. The manifold 44 has a rectangularly cylindrical shape with upper and lower flanges. As shown in FIG. 1, an exhaust pipe 45 is connected to the circumferential wall portion of the manifold 44. When an auto damper 45a is opened, the interior of the process tube 41 is evacuated through the exhaust pipe 45. The distal end of the exhaust pipe 45 is connected to a factory exhaust device 46 (FIGS. 1 and 5) outside the housing unit 1.

Figure 5:
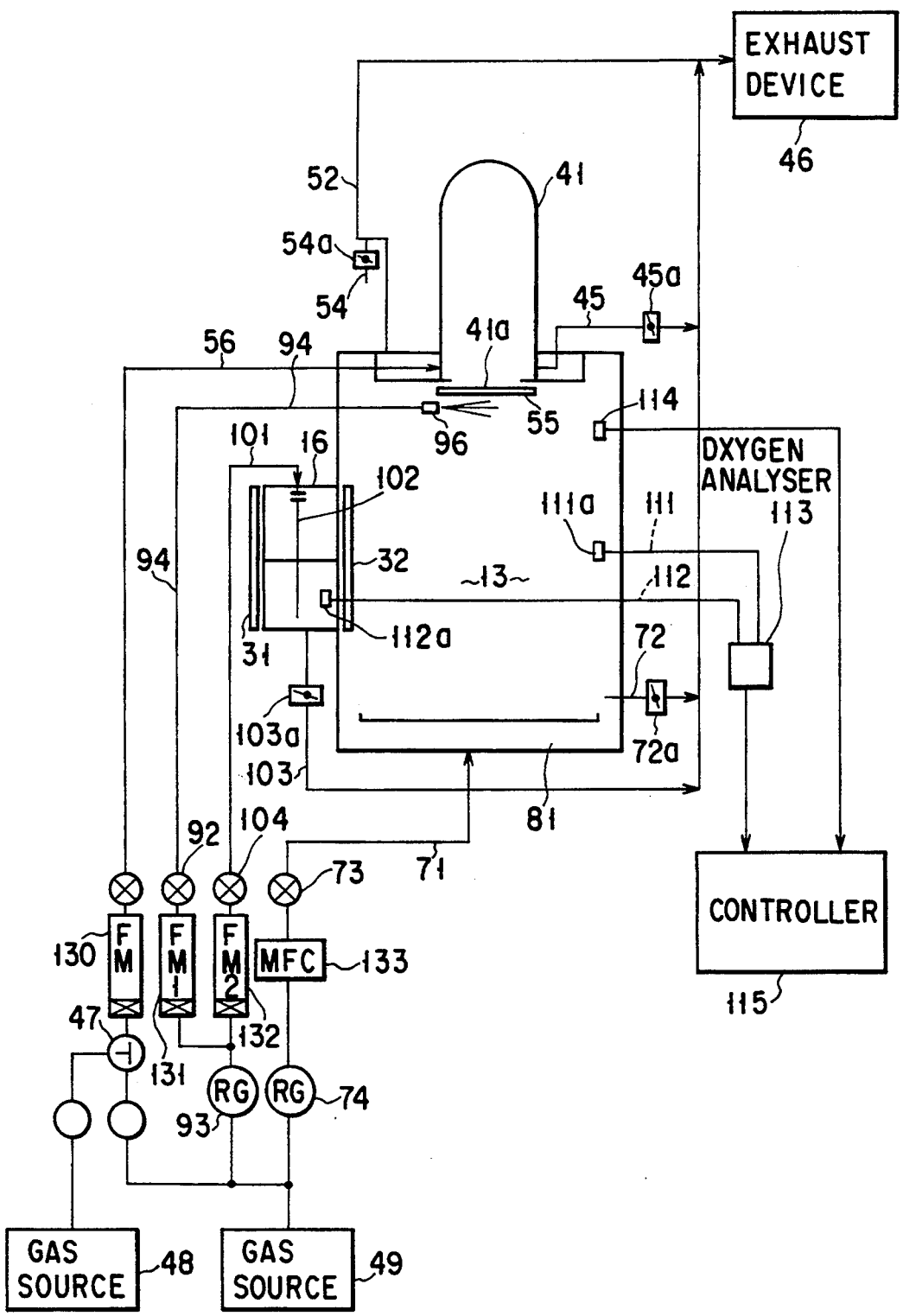
FIG. 5 is a block diagram showing the structure of the control system of the vertical type heat treatment system.

As shown in FIGS. 1 and 5, a gas supply pipe 56 is provided to the manifold 44. The gas supply pipe 56 communicates with first and second gas sources 48 and 49. A process gas and a nitrogen gas are supplied from the first and second gas sources 48 and 49, respectively, into the process tube 41 through the gas supply pipe 56. The distal end of the gas supply pipe 56 is led to the outside of the housing unit 1 and connected to the process gas supply unit 48 and the inert gas unit 49 through an automatic selector valve 47. The process gas and the $N_2$ gas can be alternately introduced into the process tube 41 by the automatic selector valve 47.

A scavenger 51 is provided around the manifold 44. The scavenger 51 is constituted by the partition wall 12 and a case 51a. A heat exhaust pipe 52 is led to the outside from the scavenger 51 to communicate with the factory exhaust device 46. Heat and unnecessary gases retaining in the scavenger 51 are always exhausted to the outside through the heat exhaust pipe 52.

The boat section 13 and the exhaust system (46 and 52) are connected through a pipe 54. The pipe 54 is provided with an auto damper 54a so that the boat section 13 is caused to communicate with or be disconnected from the exhaust system 46 and 52.

The central portion of the bottom surface of the case 51a of the scavenger 51 is open to communicate with the lower end of the manifold 44. This opening 41a serves as an inlet/outlet port of a wafer boat 61 to/from the process tube 41. An auto shutter 55 is provided to hermetically close the furnace port 41a from the lower surface through an O-ring. The auto shutter 55 is vertically moved by an opening/closing driving section 55a and pivoted in the horizontal direction.

A boat elevator 62 is provided in the boat section 13 to support the wafer boat 61 to be vertically movable. The wafer boat 61 is located immediately under the furnace port 41a and loaded/unloaded into/from the process tube 41 of the heat treatment chamber 10. The wafer boat 61 is moved upward to be loaded into the process tube 41 or is moved downward to be withdrawn from the process tube 41 as it houses the large number of wafers 5. When the wafer boat 61 is moved upward and loaded into the process tube 41, a flange 61a at the lower portion of the wafer boat 61 closes the furnace port 41a in place of the auto shutter 55, thereby hermetically closing the process tube 41.

A wafer transfer 63 is provided between the wafer boat 61 in the loading area 13 and the pass box 16 as it is supported by a transfer elevator 64 to be vertically movable. The wafer transfer 63 takes out the wafers 5 one by one from the pass box 16 and stores them in the boat 61 of the section 13, and inversely returns the wafers 5 from the wafer boat 61 into the cassettes 6.

A gas supply pipe 71 and an exhaust pipe 72 serving as the first gas supply/exhaust means are provided in the housing unit 1 in order to substitute and maintain the internal gas of the boat section 13, defined by the partition walls 12 and 14, with a positive-pressure inert gas.

The gas supply pipe 71 is connected to the primary side (suction side) of a blower fan 82 midway along a gas circulation path 81 provided under the floor of the unit 1 as a gas circulating/cooling/cleaning system (to be described later).

As shown in FIG. 5, the gas supply pipe 71 is led to the outside of the housing unit 1 and communicates with the gas source 49 through a flow regulating valve 73 and a regulator 74b. The $N_2$ gas is introduced from the gas source 49 into the boat section 13 through the gas circulation path 81. The exhaust pipe 72 has an auto damper 72a midway along it, is lead to the outside from the downstream in the boat section 13, and communicates with the factory exhaust device 46.

As shown in FIGS. 1 and 5, a gas shower mechanism 90 is provided at the upper portion of the boat section 13. A nozzle 96 of the gas shower mechanism 90 communicates with the nitrogen gas source 49 through a pipe 94. A valve 92, a flowmeter (FM1) 131, and a regulator 74a are mounted to the pipe 94, and are controlled by a controller 115. More specifically, the controller 115 detects the timing at which the wafer boat 61 is loaded from the boat section 13 into the process tube 41 and unloaded from the process tube 41 to the boat section 13, and controls the valve 92, the flowmeter (FM1) 131, and the regulator 74a such that a nitrogen gas is injected at a high speed toward the wafers 5 immediately under the furnace port 41a.

This gas shower mechanism 90 has the gas shower nozzle 96 of a special shape. The gas shower nozzle 96 is mounted on the distal end of the gas supply pipe 94 and fixed to the lower surface of the case 51a of the scavenger 51 with a bracket 93. A gas shower injection port 95b of the nozzle 96 is directed substantially in the horizontal direction.

The gas shower nozzle 96 will be described in detail with reference to FIGS. 6 to 8.

Figure 6:
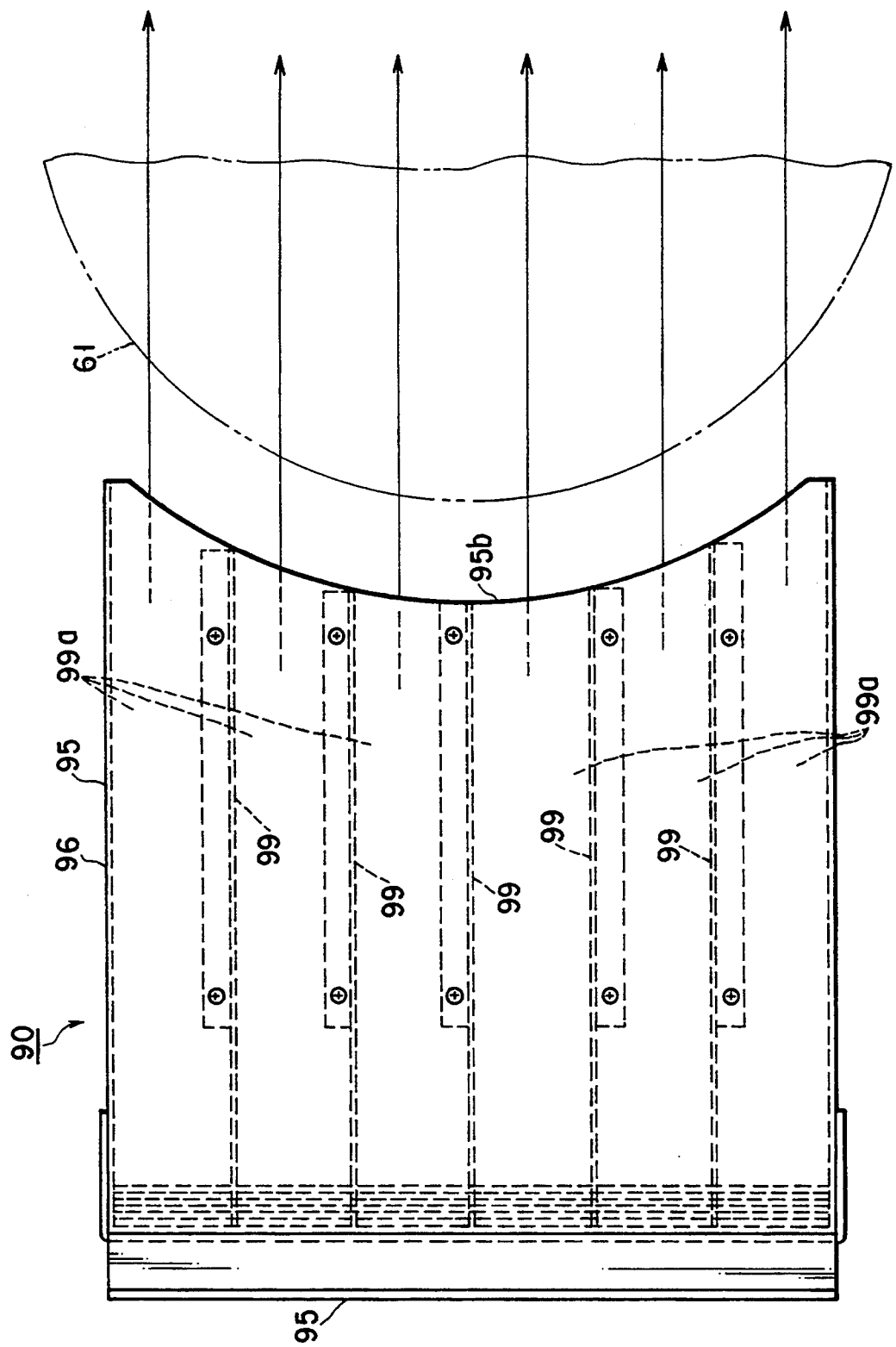
FIG. 6 is an enlarged plan view of a gas shower nozzle.
Figure 7:
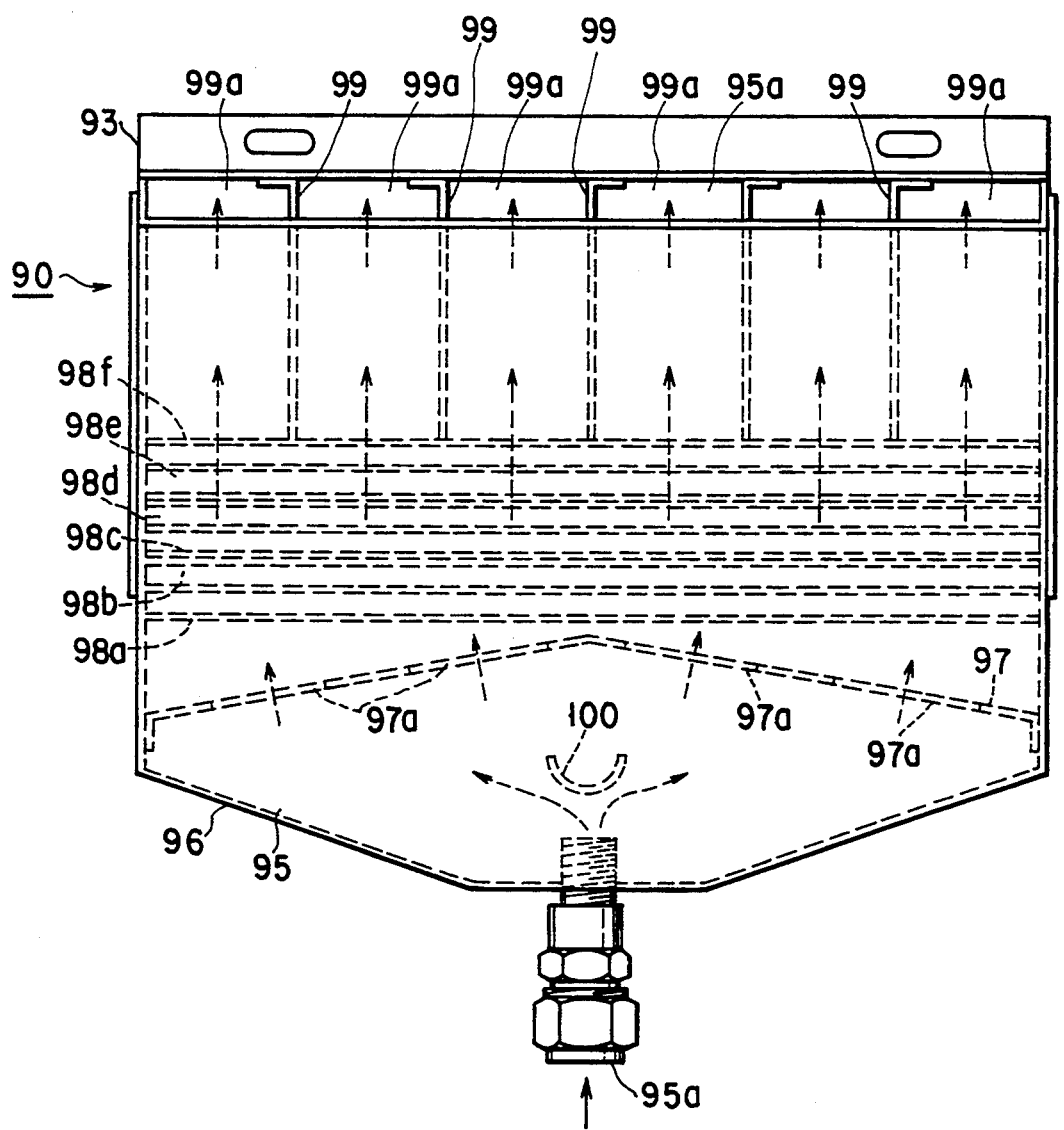
FIG. 7 is an enlarged front view of the gas shower nozzle.

As shown in FIGS. 6 and 7, the gas shower nozzle 96 has a hollow flat box-like body case 95. The body case 95 has a long, wide and thin shape. A connection port member (pipe joint) 95a is provided at the central portion of the proximal end portion (lower end of the vertically handing portion) of the body case 95, and the gas supply pipe 94 is connected to it. The gas shower injection port 95b is formed on the distal end portion (horizontal end portion) of the body case 95. The body case 95 is made of a stainless steel (SUS) thin plate. The entire length of the body case 95 covering from its proximal end to its distal end is as large as about 360 mm, the width thereof is as large as about 230 mm so that it substantially matches the diameter (entire width) of a wafer 5 as the processing target, and the thickness thereof is as small as about 14 mm.

Figure 8:
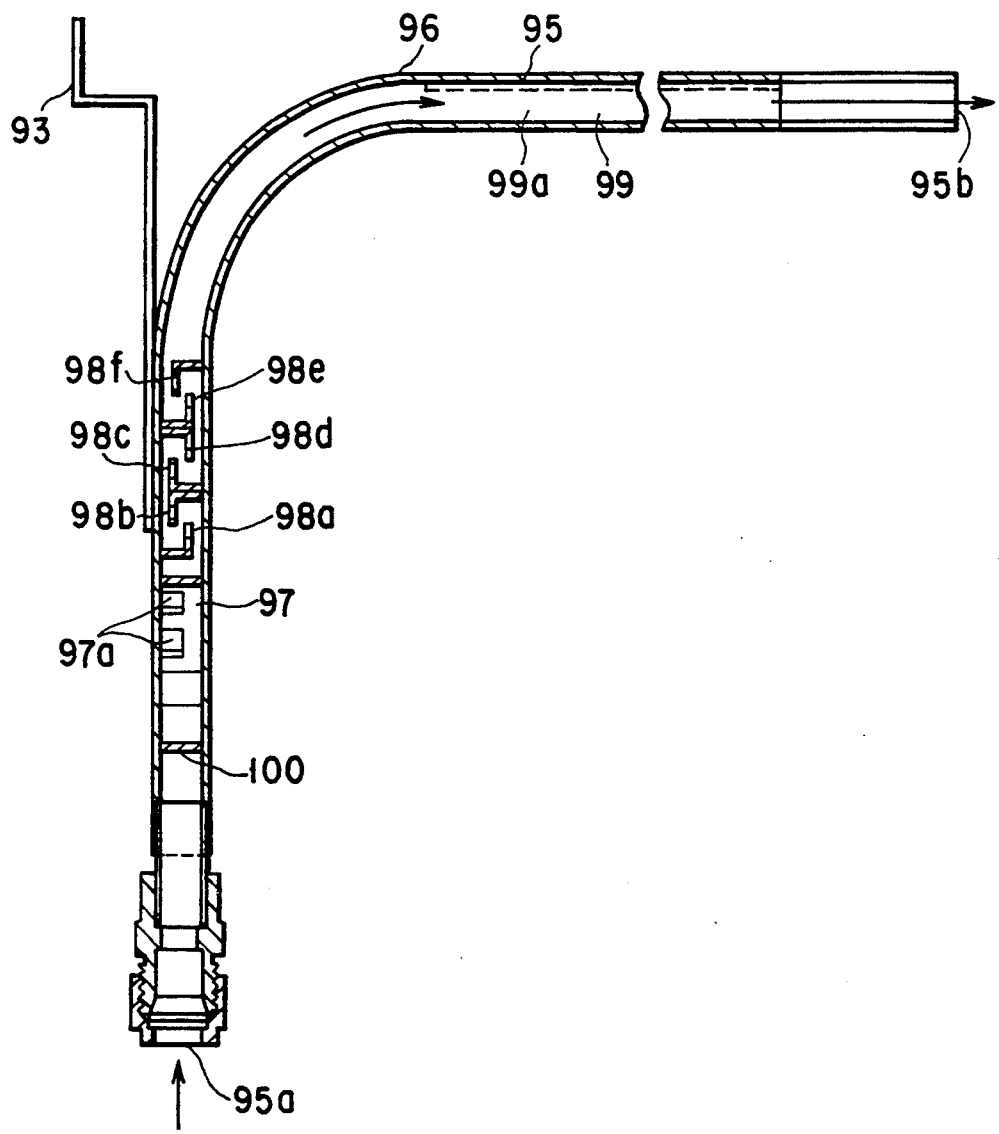
FIG. 8 is a longitudinal sectional view of the gas shower nozzle.

As shown in FIG. 8, the body case 95 has a substantially L-shaped longitudinal section. A plurality of types of baffle plates 100, 97, 98a, 98b, 98c, 98d, 98e, and 98f are mounted in the body case 95 from the proximal end side (lower end side) thereof in the order named. These baffle plates 100, 97, 98a, 98b, 98c, 98d, 98e, and 98f diffuse and change the flow of the gas introduced through the connection port 95a in the widthwise direction within the body case 95. Then, the pressure distribution in the widthwise direction of the nozzle 96 is uniformed in the stepwise manner.

The first baffle plate 100 forms a small semicircular plate opposing the connection port member 95a. The next baffle plate 97 has a plurality of notches 97a formed therein equidistantly and extends throughout the entire width in the body case 95.

As shown in FIG. 7, the third to eighth baffle plates 98a to 98f respectively extend throughout the entire width of the body case 95, thereby forming a labyrinth path, as shown in FIG. 8.

A plurality of straightening plates 99 are arranged in parallel to each other to respectively extend from a portion above the last baffle plate 98f to the distal end injection port 95b. The straightening plates 99 partition the interior of the body case 95 in the widthwise direction, and long landing sections 99a are defined by the straightening plates 99.

Since this gas shower nozzle 96 has a long landing distance, it can blow the gas at a flow speed (0.75 m/sec) higher than the blow speed from a ULPA filter 85. When the wafer boat 61 is to be loaded/unloaded into/from the process tube 41, if the nozzle 96 linearly blows the $N_2$ gas at 50 to 100 l/min horizontally toward the portion immediately under the furnace port 41a, the $N_2$ gas shower passes through the wafers 5 as it is deprived of impurities, e.g., the $O_2$ gas, and is cooled simultaneously.

As shown in FIGS. 4 and 5, the pass box 16 is provided with a gas supply pipe 101, an injector 102, and an exhaust pipe 103 that serve as the second gas supply/exhaust means. The gas supply pipe 101 is connected to the gas source 49 through a valve 104 and the regulator 74a. The distal end of the gas supply pipe 101 is connected to the injector 102 in the pass box 16 from above. The $N_2$ gas can be constantly introduced into the pass box 16 by injection with the injector 102 at 50 l/min from one side of the pass box 16. The other side of the pass box 16, which is opposite to the side connected to the injector 102, is connected to the exhaust pipe 103. The exhaust pipe 103 is connected to the factory exhaust device 46 through an auto damper 103a, so that it can constantly evacuate the pass box 16 by purge the gas from the pass box 16.

The injector 102 is a pipe-shaped injector extending from the upper end portion to the lower end portion in the pass box 16. A large number of small holes 102a are formed in the circumferential surface of the injector 102 at the equal pitch, and the $N_2$ gas is injected into the pass box 16 horizontally through the small holes 102a. The injector 102 can inject the $N_2$ gas at a speed of 0.75 m/sec. Since many slits are formed in the two side surfaces of each cassette 6, the $N_2$ gas flows among the wafers 5 through these slits.

As shown in FIG. 5, a distal end opening 111a of a gas communication path 111 is provided in the boat section 13 so that the gas in the boat section 13 can be detected. The proximal end of the gas communication path 111 communicates with an oxygen analyzer 113. Similarly, a distal end opening 112a of a gas communication pipe 112 is provided in the pass box 16 so that the gas in the pass box 16 can be detected. Similarly again, the proximal end of the gas communication pipe 112 communicates with the oxygen analyzer 113. The oxygen analyzer 113 incorporates a three-way valve and a gas pump and measures and detects the oxygen concentration in the boat section 13 and the pass box 16. The oxygen analyzer 113 is connected to the input of the controller 115. A pressure sensor 114 is provided in the boat section 13. An internal pressure detection signal is input to the controller 115.

The controller 115 receives signals from the oxygen analyzer 113 and the pressure sensor 114, and performs automatic sequence control of the respective operational portions, e.g., the auto dampers 45a, 54a, 72a, and 103a, the valves 47, 73, 92, and 104, the front door 20, the auto doors 31 and 32, the auto shutter 55, the carrier transfer 22, the wafer transfer 63, and the boat elevator 62, based on the received signals. In this case, the controller 115 determines whether or not the detected oxygen concentration is 20 p.p.m. or less and sends an instruction signal to the gas supply system based on the determination result.

Even when the processing operations of the wafers are repeatedly performed, a gas circulating/cooling/cleaning system (81 to 87) maintains the $N_2$ gas atmosphere in the boat section 13 at a high purity and prevents an abnormal temperature rise. Regarding the system configuration of this gas circulating/cooling/cleaning system, the gas circulation path 81 for flowing the $N_2$ gas in the boat section 13 to the outside of the system, cleaning and cooling it, and feeding it back into the boat section 13 is provided under the floor of the apparatus body 1. The blower 82 is provided midway along the gas circulation path 81, and a chemical filter 83 serving as the gas filter is connected to the secondary side of the blower 82. A gas cooling unit 84 is connected to the secondary side of the chemical filter 83. The chemical filter 83 is a gas cleaning unit that incorporates a metal getter, e.g., zirconia, that absorbs gaseous impurities (water, oxygen, hydrocarbon, and the like) such that the metal getter can be exchanged in accordance with applications. The gas cooling unit 84 is a radiator type unit obtained by providing heat radiator fins to a cooling pipe through which water can flow, and has a cooling performance of cooling the temperature of the gas blown from its secondary side to 50° C. or less.

The filter 85 serving as the gas filter for receiving the $N_2$ gas from this gas circulation path 81 and blowing it into the boat section 13 is provided at one side surface in the boat section 13. This filter 85 is a vertical absolute filter of the ULPA grade which filters and catches the fine-particle impurities (particles, e.g., dust) in the $N_2$ gas and blows the filtered $N_2$ gas into the boat section 13 from one side as a horizontal laminar flow.

In order to further ensure the horizontal laminar flow state of the $N_2$ gas, the straightening plate 86 formed with a large number of holes is vertically provided at the other side surface in the boat section 13 to oppose the filter 85. The $N_2$ gas is drawn by suction from the space 87 behind the straightening plate 86 into the gas circulation path 81 through the straightening plate 86.

A case wherein the semiconductor wafers 5 are to be subjected to film deposition by the above heat treatment apparatus will be described with reference to FIG. 9.

The door 20 is opened, and the cassettes 6 are loaded from the next room 2 into the section 15 (step S1). Twenty-five 8-inch silicon wafers 5 are housed in each cassette 6. The cassettes 6 are rotated through 90° by the posture change mechanisms 21, so that the array of the wafers 5 is changed from the vertical to horizontal direction (step S2). The arm 22 is swung through 90° and moved further upward, thereby temporarily storing the cassettes 6 at the station 24 (step S3).

The cassettes 6 are removed from the station 24 and moved downward to be located at the pass box 16 (step S4). The front door 31 of the pass box 16 is opened (step S5). The cassettes 6 are loaded into the pass box 16 and placed on the corresponding stages 18 (step S6). The front door 31 of the pass box 16 is closed (step S7). The interior of the pass box 16 is evacuated, and simultaneously the nitrogen gas is supplied into the pass box 16 to fill the pass box 16 with it (step S8).

Since the boat section 13 is comparatively narrow, in initial replacement, the auto damper 72a of the exhaust pipe 72 is opened to evacuate the boat section 13 by the factory exhaust device 46, and simultaneously the $N_2$ gas is supplied from the gas supply pipe 71 at about 400 l/min. The outer air of the boat section 13 can be easily substituted with the nitrogen gas in a comparatively small N2 gas supply amount.

After this substitution, in the constant state, the gas supply amount from the gas supply pipe 71 is decreased to a small value of about 50 l/min, and the auto damper 72a of the exhaust pipe 72 is closed, thereby maintaining the interior of the loading area 13 in the $N_2$ gas atmosphere at an appropriate positive pressure (about 0.9 mmH$_2$O which is higher than the pressure of the clean room 2 by about 0.2 mmH$_2$O when the differential pressure between the clean room 2 and the maintenance room 4 is 0.6 to 0.7 mmH$_2$O) by gap exhaustion of the loading area 13 or by the pressure adjusting dampers. The leak gas caused by gap exhaustion is constantly exhausted to the outside of the factory by the branch pipe 54 of the heat exhaust pipe 52 of the scavenger 51 which has the auto damper 54a.

In the initial substitution in the boat section 13, the auto damper 72a is opened to evacuate the boat section 13 by the factory exhaust device 46, and the $N_2$ gas is supplied at about 200 to 400 l/min. After this substitution, in the constant state, the supply amount of the $N_2$ gas is decreased to about 50 l/min, and the auto damper 72a of the exhaust pipe 72 is closed. The interior of the section 13 is maintained in the $N_2$ gas atmosphere at an appropriate positive pressure by gap exhaust of the boat section 13 or by adjusting the pressure dampers. A leak gas caused by gap exhaustion is exhausted to the outside of the factory through the pipe 54.

A horizontal flow of the $N_2$ gas is constantly injected from the gas supply pipe 101 into the pass box 16 surrounding the stages at 18 at 50 l/min from one side through the injector 102, and is exhausted such that it is purged from the exhaust pipe 103 at the other side of the pass box 16. Then, as the pass box 16 has a small capacity, the outer air is quickly substituted with the nitrogen gas in a very small $N_2$ gas supply amount.

When the oxygen concentration becomes less than 20 p.p.m. in both the pass box 16 and the boat section 13, the rear door 32 is opened (step S9). The wafers 5 are removed from the cassettes 6 in units of five by the wafer transfer 63 and loaded into the wafer boat 61 (step S10). During this operation, since the internal gas of the pass box 16 has been substituted with the $N_2$ gas atmosphere, outer air or the like will not enter the boat section 13.

When the cassettes 6 become empty, the rear door 32 is closed (step S11). The controller 115 determines whether or not the wafers 5 are fully loaded into the wafer boat 61 (step S12). If NO in step S12, the operations of S4 to S11 are repeated. If YES in step S12, a gas shower instruction signal is sent from the controller 115 to the,components 74a, 92, and 131, and the shower of the nitrogen gas is injected from the nozzle 96 toward a portion immediately under the furnace port 41a (step S13).

Subsequently, the shutter 55 is opened, and the wafer boat 61 is moved upward by the elevator 62 and loaded into the process tube 41 through the furnace port 41a (step S14). At this time, since the shower gas is directly blown to the wafers 5 as well as to the gaps among the wafers 5, both the particles and oxygen gas molecules are removed.

When loading of the wafer boat 61 into the process tube 41 is completed, the furnace port 41a is closed with the lower flange 61a. The $N_2$ gas in the process tube 41 is exhausted through the exhaust pipe 45, and the process gas is supplied into the process tube 41 through the gas supply pipe 56. The wafers 5 in the process tube 41 are heated to a process temperature by the heater 42. Then, a desired film is formed on each wafer 5 (step S15). Alternatively, the process tube 41 may be heated to a predetermined temperature before boat loading, and the wafer boat 61 may be loaded into the process tube 41.

After this processing, the process gas in the process tube 41 is exhausted through the exhaust pipe 45, and the $N_2$ gas is supplied through the gas supply pipe 56 to substitute the internal gas of the process tube 41 with the $N_2$ gas which is the same as that in the lower chamber 13. When a heat treatment completion signal is input to the controller 115, a gas shower from the nozzle 96 is resumed (step S16). Then, the processed wafers 5 are unloaded from the process tube 41 together with the boat 61 (step S17). At this time, since the shower gas is directly blown to the wafers 5, the wafers 5 are quickly cooled down to near room temperature within a short period of time. Thus, the wafers 5 can be quickly conveyed to the subsequent step. Also, deposition of a spontaneous oxide film is also prevented.

After boat unloading, the rear door 32 of the pass box 16 is opened (step S18). The processed wafers 5 are transferred from the wafer boat 61 to the cassettes 6 (step S19). After the wafers 5 are fully placed on the cassettes 6, the rear door 32 of the pass box 16 is closed (step S20). Subsequently, the front door 31 is opened (step S21), and the cassettes 6 are unloaded from the pass box 16 (step S22). The front door 31 is closed (step S23), the interior of the pass box 16 is evacuated, and simultaneously the nitrogen gas is supplied into the pass box 16, thereby filling the pass box 16 with the nitrogen gas (step S24).

The controller 115 determines whether or not all the wafers 5 are transferred from the wafer boat 61 to the cassettes 6 (step S25). If NO in step S25, the operations of above steps S18 to S24 are repeated until all the wafers 5 are transferred from the wafer boat 61 to the cassettes 6.

If YES in step S25, whether or not the process is to be further continued is determined (step S26). If NO in step S26, the operations of above steps S4 to S25 are repeated. If YES in step S26, the controller 115 sends an end signal to the respective components of the apparatus, thereby completing processing.

According to the above heat treatment apparatus, the outer air will not substantially enter the boat section 13 during loading/unloading of the wafers 5, so that the entire consumption amount of the nitrogen gas is decreased.

Also, the interior of the boat section 13 can be maintained in a positive, high-purity inert gas atmosphere. This is very effective in suppressing formation of natural oxide film during loading/unloading of the wafers 5 into/from the process tube 41, deposition of particles on the wafers 5, and chemical contamination (formation of a spontaneous oxide film or the like).

When this wafer heat treatment operation is repeatedly performed, gaseous impurities, e.g., carbon, may be formed in the $N_2$ gas atmosphere in the boat section 13 or particle impurities (particles), e.g., oil mist or dust, are formed especially during loading/unloading of the wafer boat 61 into/from the process tube 41. These impurities are deposited on the semiconductor wafers 5 or cause chemical contamination, leading to degradation in characteristics or yield of the semiconductor elements.

Simultaneously, due to dissipation of heat from the interior of the process tube 41 upon opening the furnace port 41a or radiation heat from the processed semiconductor wafers 5 that are heated to a high temperature (about 1,000° C.), the temperature of the $N_2$ gas atmosphere in the boat section 13 is increased to an abnormal level. For these reasons, a clean $N_2$ gas is constantly supplied as the purge gas from the gas supply pipe 71, and the gas circulating/cooling/cleaning system (81 to 87) operates constantly to cause the $N_2$ gas in the boat section 13 to flow in the gas circulation path 81 together with the impurities through the straightening plate 86 by the function of the blower 82. The gaseous impurities (water, oxygen, hydrocarbon, and the like) in the circulating gas are absorbed by the chemical filter (gas cleaning unit) 83, and the $N_2$ gas is cooled to 50° C. or less through the gas cooling unit 84. Furthermore, the fine-particle impurities (particles such as dust) in the $N_2$ gas are filtered and caught by the absolute type particle filter 85 of the ULPA grade, and the filtered $N_2$ gas is blown into the loading area 13 from one side as a horizontal laminar flow and fed back.

In this manner, the $N_2$ gas atmosphere in the boat section 13 is maintained at a high purity, and simultaneously abnormal temperature rise is prevented. Furthermore, since the $N_2$ gas is blown from the filter 85 into the boat section 13 as a horizontal laminar flow from one side, the impurities, e.g., $O_2$ gas molecules among the wafers 5, are removed in the boat section 13 as well.

Furthermore, during boat loading/unloading, the gas shower mechanism 90 operates so that the $N_2$ gas flow lands through the long landing sections in the nozzle 96. The $N_2$ gas is linearly blown at a high speed as a 10 horizontal wide, thin film-like flow toward a portion near the lower portion of the furnace port 41a immediately sideways from the distal end injection port of the nozzle 96. The impurities, e.g., $O_2$, and heat among the wafers 5 are reliably expelled by the $N_2$ gas shower. As a result, deposition of the impurities on the wafers 5 or chemical contamination (formation of natural oxide film or the like) can be suppressed further reliably.

What is claimed is:

1. A vertical heat treatment system for heat treating a large number of semiconductor wafers housed in a boat simultaneously, comprising:

a heat treatment unit having a boat loading/unloading port;

a boat section communicating with said heat treatment unit through the boat loading/unloading port;

elevator means for loading/unloading said boat between said boat section and said heat treatment unit through the boat loading/unloading port;

a cassette section provided adjacent to said boat section;

wafer transfer means for transferring wafers between a cassette and said boat;

gas supply means for supplying a non-oxidization gas into said boat section; and gas shower means for blowing the non-oxidization gas to the wafers directly under the boat loading-/unloading port of the heat treatment unit, said non-oxidation gas being blown locally by said gas shower means to the wafers while said elevator means moves the boat up and down.

2. A system according to claim 1, wherein
   said gas shower means has a gas supply pipe for introducing the non-oxidization gas and a gas shower nozzle connected to a distal end of said gas supply pipe, and
   said gas shower nozzle has an injection port for injecting the non-oxidization gas to the wafers in a direction perpendicular to a direction along which the wafers are aligned and throughout substantially an entire width of the wafers.

3. A system according to claim 1, wherein said gas shower means comprises
   a hollow flat nozzle body having a gas supply pipe connection port at a proximal end thereof and a gas injection port at a distal end thereof,
   a plurality of baffle plates, aligned from said proximal end of said nozzle body in order, for uniforming a-pressure distribution of the gas in said gas supply pipe in a stepwise manner while diffusing and changing a flow of the gas supplied thereto through a gas supply pipe connection port in a widthwise direction in said nozzle body, and a plurality of straightening plates aligned to extend in said nozzle body in parallel to each other from a last baffle plate therein to the gas injection port, whereby a flow of the gas is straightened at landing sections among said straightening plates and the gas is linearly blown in a wide, thin film manner through the gas injection port.

4. A system according to claim 1, further comprising shutter means for closing the boat loading/unloading port.

5. A system according to claim 1, further comprising evacuating means for evacuating said boat section.

6. A system according to claim 1, further comprising oxygen concentration detecting means for detecting an oxygen concentration of the gas in said boat section.

7. A system according to claim 1, further comprising pressure control means for controlling an internal pressure of said boat section.

8. A system according to claim 1, further comprising a gas circulating/cooling/cleaning system, provided to said boat section, for circulating, cooling, and cleaning the gas in said boat section.

9. A system according to claim 1, further comprising a pass box provided to said cassette section, and means for filling an interior of said pass box with the non-oxidization gas when the wafers are to be loaded/unloaded into/from said boat section.

10. A vertical heat treatment system for heat treating a large number of semiconductor wafers housed in a boat simultaneously, comprising:

a heat treatment unit having a boat loading/unloading port;

a boat section communicating with said heat treatment unit through the boat loading/unloading port;

elevator means for loading/unloading said boat between said boat section and said heat treatment unit through the boat loading/unloading port;

a cassette section provided adjacent to said boat section;

wafer transfer means for transferring wafers between a cassette and said boat;

gas supply means for supplying a non-oxidization gas into said boat section;

a gas circulating/cooling/cleaning system for circulating, cooling, and cleaning the gas in said boat section, said gas circulating/cooling/cleaning system comprising gas blowing means for blowing the non-oxidization gas as a horizontal laminar flow from one side surface to the other side surface of said boat section; and straightening means, having a front surface opposing said gas blowing means and a rear surface forming part of a gas circulation path, for straightening the flow of non-oxidization gas which is blown out.

11. A system according to claim 10, wherein said gas circulating/cooling/cleaning system has a gas circulation path for exhausting the gas from said boat section and returning the gas into said boat section, and a blower, a filter, and a gas cooling unit respectively provided midway along said gas circulation path.

12. A system according to claim 11, wherein said filter has a chemical filter member for absorbing a gaseous impurity in the non-oxidization gas, and a particle filter for catching a fine-particle impurity in the non-oxidization gas.

13. A system according to claim 10, wherein said gas blowing means has a filter member housed in a case.

14. A system according to claim 10 further comprising pressure control means for controlling an internal pressure of said boat section.

15. A system according to claim 10, further comprising gas shower means for blowing the non-oxidization gas to the wafers in the vicinity of the boat loading/unloading port.

16. A system according to claim 10, further comprising a pass box provided to said cassette section, and means for filling an interior of said pass box with the non-oxidization gas when the wafers are to be loaded/unloaded into/from said boat section.

17. A vertical heat treatment system for heat treating a large number of semiconductor wafers housed in a boat simultaneously, comprising:

a heat treatment unit having a boat loading/unloading port;

a boat section communicating with said heat treatment unit through the boat loading/unloading port;

elevator means for loading/unloading said boat between said boat section and said heat treatment unit through the boat loading/unloading port;

a cassette section provided adjacent to said boat section;

wafer transfer means, mounted in the boat section, for transferring wafers between a cassette and said boat;

first gas supply means for supplying a non-oxidization gas into said boat section;

a pass box having a first opening with a front door communicating with said cassette section and a second opening with a rear door communicating with said boat section said first opening receiving the cassette from the cassette section; and second gas supply means for supplying the non-oxidization gas into said pass box.

18. A system according to claim 17, wherein said second gas supply means has a gas injector for injecting the non-oxidization gas to gaps among the wafers in said pass box.

19. A system according to claim 17, further comprising an exhaust pipe for exhausting the gas from said pass box.

20. A system according to claim 17, further comprising pressure control means for controlling an internal pressure of said boat section.

21. A system according to claim 17, further comprising gas shower means for blowing the non-oxidization gas to the wafers in the vicinity of the boat loading/unloading port.

22. A system according to claim 17, further comprising a gas circulating/cooling/cleaning system, provided to said boat section, for circulating, cooling, and cleaning the gas in said boat section.

* * * * *